US009602920B2

(12) United States Patent
Haiut

(10) Patent No.: US 9,602,920 B2
(45) Date of Patent: Mar. 21, 2017

(54) METHOD AND APPARATUS FOR ULTRA-LOW POWER SWITCHING MICROPHONE

(71) Applicant: DSP Group LTD., Herzeliya (IL)

(72) Inventor: Moshe Haiut, Ramat Gan (IL)

(73) Assignee: DSP GROUP LTD., Herzliya (IL)

( * ) Notice: Subject to any disclaimer, the term of this patent is extended or adjusted under 35 U.S.C. 154(b) by 102 days.

(21) Appl. No.: 14/600,026

(22) Filed: Jan. 20, 2015

(65) Prior Publication Data

US 2015/0215698 A1 Jul. 30, 2015

Related U.S. Application Data

(60) Provisional application No. 61/933,316, filed on Jan. 30, 2014.

(51) Int. Cl.
*H03F 99/00* (2009.01)
*H04R 3/00* (2006.01)
*H04R 1/04* (2006.01)

(52) U.S. Cl.
CPC ................. *H04R 3/00* (2013.01); *H04R 1/04* (2013.01); *H04R 2201/003* (2013.01)

(58) Field of Classification Search
CPC ....... H04R 3/00; H04R 1/04; H04R 2201/003
See application file for complete search history.

(56) References Cited

U.S. PATENT DOCUMENTS

2007/0281761 A1* 12/2007 Kim .................... H04M 1/6008 455/575.2
2011/0031808 A1* 2/2011 Hwang ................. G06F 13/385 307/39
2014/0254837 A1* 9/2014 Mortensen .............. H03F 3/187 381/120
2016/0037257 A1* 2/2016 Josefsson ................. H04R 3/06 381/101

* cited by examiner

*Primary Examiner* — Muhammad N Edun
(74) *Attorney, Agent, or Firm* — Reches Patents

(57) ABSTRACT

A scheme is described to switch the power supply to the MEMS microphone on and off in a cyclic manner that is synchronized with the associated ADC sampling rate. In this way the MEMS microphone amplifier, whether it is a J-FET transistor or an operational amplifier, is off most of the cycle time, and is turned on only for a few micro-seconds prior to the sample-and-hold timing of the ADC device. By this method, the average power consumption of an existing analog MEMS microphone can be reduced by a factor of 10 or more.

24 Claims, 9 Drawing Sheets

97

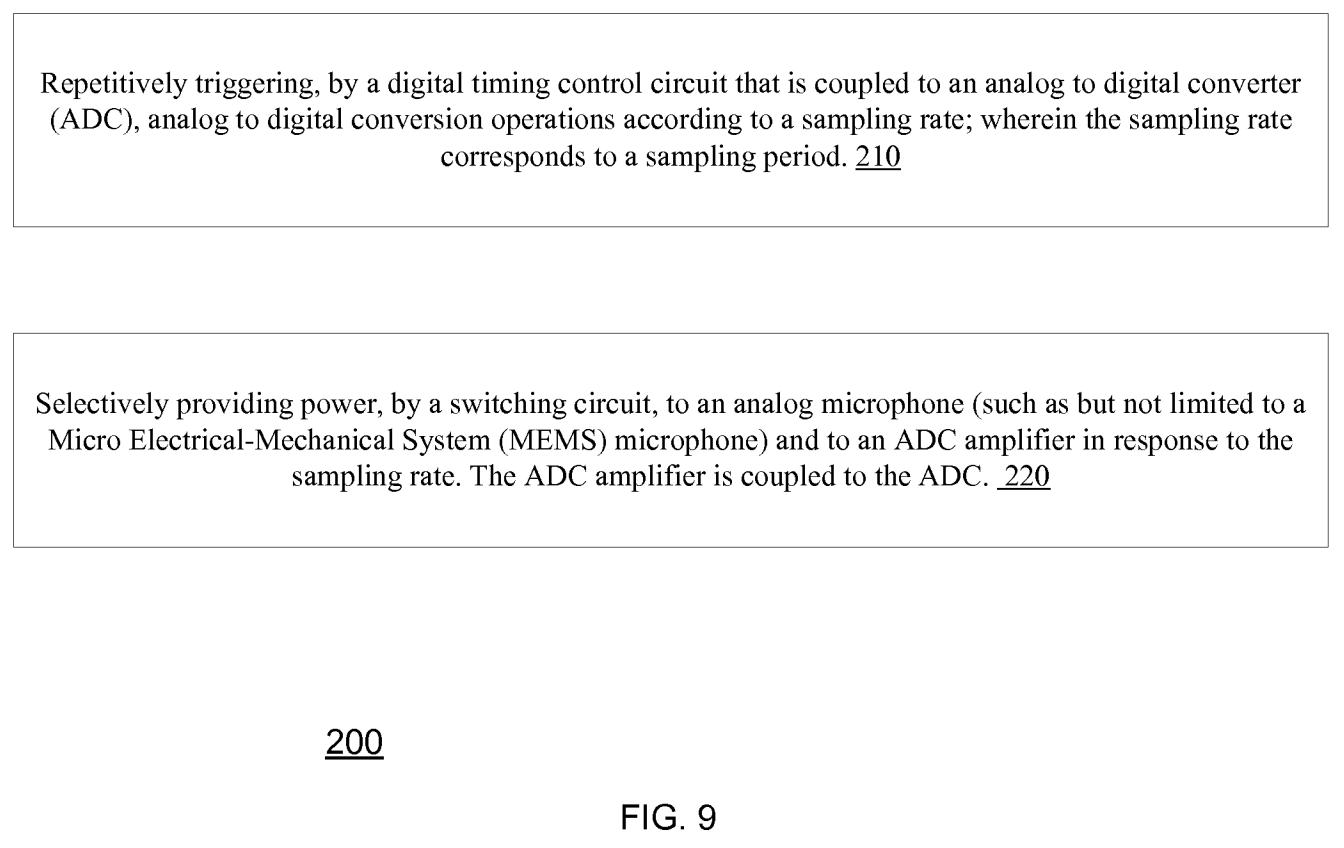

Repetitively triggering, by a digital timing control circuit that is coupled to an analog to digital converter (ADC), analog to digital conversion operations according to a sampling rate; wherein the sampling rate corresponds to a sampling period. 210

Selectively providing power, by a switching circuit, to an analog microphone (such as but not limited to a Micro Electrical-Mechanical System (MEMS) microphone) and to an ADC amplifier in response to the sampling rate. The ADC amplifier is coupled to the ADC. 220

200

FIG. 9

METHOD AND APPARATUS FOR ULTRA-LOW POWER SWITCHING MICROPHONE

RELATED APPLICATIONS

This application claims the priority of U.S. provisional patent Ser. No. 61/933,316 filing date Jan. 30, 2014 which is incorporated herein by reference in its entirety.

FIELD OF THE INVENTION

This invention relates to the field of microphones such as but not limited to MEMS (Micro Electrical-Mechanical System) microphones.

BACKGROUND OF THE INVENTION

A MEMS microphone is also called a microphone chip or silicon microphone. MEMS microphones are usually referred to as being of two main types: analog and digital. Both types are based on a membrane or diaphragm that is combined with a permanently charged capacitor that changes its capacitance according to the pressure derived from acoustic waves. This is commonly known as an electret microphone. The pressure-sensitive diaphragm is etched directly into a silicon chip by MEMS techniques, and is usually accompanied with a preamplifier; this is referred to as an 'analog MEMS microphone'. To be more readily integrated with modern digital products an external analog-to-digital converter (ADC) is usually used together with the analog MEMS microphone. "Digital MEMS microphones" include an ADC circuit in the same package.

An external power supply is required by both the analog and digital MEMS microphone. In the case of an analog MEMS microphone, the power is consumed by the integrated preamplifier. A typical electret microphone preamplifier circuit uses an Field Effect Transistor (FET) in a common_source configuration which must be externally powered by a supply voltage.

It is becoming more common, however, for the preamplifier to be a low power operational amplifier. The analog MEMS microphone represents the lowest power consumption case. Digital MEMS microphones consume more power as they also contain an integrated ADC in addition to the amplifier. The use case is that the microphone in a mobile or wearable device needs to be active, even when the device is sleeping, such that it can detect any wake up voice commands. Hence it is highly desirable that the MEMS microphone consumes ultra-low power. Target power consumption is in the order of less than 25 microwatts whereas the usual power consumption of an analog MEMS microphone is in the order of 200 microwatts and digital MEMS microphones consume more.

SUMMARY OF THE INVENTION

There is provided a device and a method for minimizing a power consumption of the analog parts of an analog microphone down to few micro watts (and even below) while still using existing analog microphones. A first power supply coupled to the analog microphone is repetitively provided (turned on) or prevented from being provided (turned off) in a cyclic manner that is synchronized with the ADC sampling rate. In this way the microphone amplifier, whether it is a J-FET transistor or an operational amplifier, is off most of the cycle time, and is turned on only for a few micro-seconds prior to the sample-and-hold timing of the ADC device. By this method, the average power consumption of an existing analog microphone can be reduced by a factor of 10 or more. A microphone amplifier is fed by a first power supply V+. An ADC amplifier that precedes the ADC is fed by a second power supply V0. A capacitor is coupled between an output of the analog microphone and an input of the ADC and provides DC isolation.

The device may include a switching circuit. The switching circuit may be controlled by the same digital timing control unit that provides the sampling rate for the ADC or may be affected by the control signals generated by the timing control unit.

The analog switches are controlled by the digital timing control unit to close a settling time, Ts, before the ADC starts its sample-and-hold phase of an analog to digital conversion operation, and then to open again after a hold time, Th, which is the time required by the ADC for the sample-and-hold phase. The settling time Ts is to ensure that after the V+ supply has been switched on, the output of the microphone internal amplifier has reached its final (desired) DC voltage and also that the ADC amplifier's input junction has reached its final (desired) DC voltage level.

The duration of the setting time, Ts, can typically be very short, in the order of 1 or 5 microseconds, as neither of the microphone amplifier and the ADC amplifier contains capacitors or inductors. The sample-and-hold time, Th, for an ADC in this application is typically in the order of 7 μs. Hence, every sampling period of a duration of Tsampling, the analog switches are closed for a time of Ts+Th.

Hence, taking the example of an ADC sampling rate of 8000 samples per second, the sampling time, Tsampling will be 125 μs and for values of Ts and Th of 5 μs and 7 μs respectively, the analog switches will be closed for 12 μs every 125 μs. Power is therefore applied to the microphone amplifier for only about $1/10^{th}$ of the time and hence the power consumption is reduced by a factor of 10. To further reduce the power consumption of the total system, an additional power switch may be added to the ADC amplifier.

According to an embodiment of the invention there may be provided a device that may include an analog microphone; an analog to digital converter (ADC); an ADC amplifier; a digital timing control circuit; and a switching circuit. The digital timing control circuit may be configured to repetitively trigger analog to digital conversion operations according to a sampling rate; wherein the sampling rate corresponds to a sampling period. The switching circuit may be configured to selectively provide power to the analog microphone and to the ADC amplifier in response to the sampling rate.

The switching circuit may be configured to prevent the supply of power to the microphone and to the ADC amplifier during power prevention periods that have a duration that equals a majority of the sampling period.

The device may include a capacitor coupled between an output of the analog microphone and an input of the ADC amplifier.

The switching circuit may be configured to disconnect the capacitor from the ADC amplifier during at least a majority of power prevention periods.

The switching circuit may be configured to (a) start powering the analog microphone and the ADC amplifier a settling period before a beginning of each digital to analog conversion operation and (b) stop powering the analog microphone and the ADC amplifier after the ADC completed a sample and hold phase of the analog to digital conversion operation; wherein during each settling period the analog microphone and the ADC amplifier are expected to settle.

The settling period may have a duration that is a fraction (for example between less than one percent till sixty percent) of the sampling period.

The switching circuit may include (i) a first switch that is coupled between the analog microphone and a first power supply, and (ii) a second switch that is coupled between the capacitor and the ADC amplifier.

The switching circuit may include (i) a first switch that is coupled between the analog microphone and a first power supply, (ii) a second switch that is coupled between the capacitor and the ADC amplifier, and (iii) a third switch that is coupled between a second power supply and the ADC amplifier.

The first switch and the third switch may be configured to be closed an intermediate period before the second switch is closed.

The switching circuit may be configured to disconnect the capacitor from the ADC amplifier during each power prevention period and each intermediate period that follows each power prevention period, wherein during each additional period a direct current (DC) level of an output of the analog microphone and a DC voltage level of an input port of the ADC amplifier is expected to settle.

The duty cycle of the analog microphone does may not exceed 10 percent.

The microphone may be a Micro Electrical-Mechanical System (MEMS) microphone.

According to an embodiment of the invention there may be provided a method, may include repetitively triggering, by a digital timing control circuit that is coupled to an analog to digital converter (ADC), analog to digital conversion operations according to a sampling rate; wherein the sampling rate corresponds to a sampling period; and selectively providing power, by a switching circuit, to an analog microphone and to an ADC amplifier in response to the sampling rate; wherein the ADC amplifier is coupled to the ADC. These stages may be executed concurrently—a triggering of the ADC occurs in parallel (or almost in parallel) to the provision of power to the ADC amplifier and the analog microphone (especially to a microphone amplifier). The ADC may be powered constantly or almost constantly.

The selectively providing of power may include preventing the supply of power to the microphone and to the ADC amplifier during power prevention periods that have a duration that equals a majority of the sampling period.

The method may include a capacitor coupled between an output of the analog microphone and an input of the ADC amplifier.

The method may include disconnecting the capacitor from the ADC amplifier during at least a majority of power prevention periods.

The method may include starting to power the analog microphone and the ADC amplifier a settling period before a beginning of each digital to analog conversion operation; stopping to power the analog microphone and the ADC amplifier after the ADC completed a sample and hold phase of the analog to digital conversion operation; wherein during each settling period the analog microphone and the ADC amplifier are expected to settle.

The settling period may have a duration that is a fraction of the sampling period.

The switching circuit may include (i) a first switch that is coupled between the analog microphone and a first power supply, and (ii) a second switch that is coupled between the capacitor and the ADC amplifier.

The switching circuit may include (i) a first switch that is coupled between the analog microphone and a first power supply, (ii) a second switch that is coupled between the capacitor and the ADC amplifier, and (iii) a third switch that is coupled between a second power supply and the ADC amplifier.

The method may include closing the first switch and the third switch an intermediate period before closing the second switch.

The method may include disconnecting the capacitor from the ADC amplifier during each power prevention period and each intermediate period that follows each power prevention period, wherein during each additional period a direct current (DC) level of an output of the analog microphone and a DC level of an input port of the ADC amplifier is expected to settle.

The duty cycle of the analog microphone does may not exceed 10 percent.

The microphone may be a Micro Electrical-Mechanical System (MEMS) microphone.

DESCRIPTION OF DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 9 is flow chart of a method according to an embodiment of the invention.

DETAILED DESCRIPTION OF THE INVENTION

Figure 1:
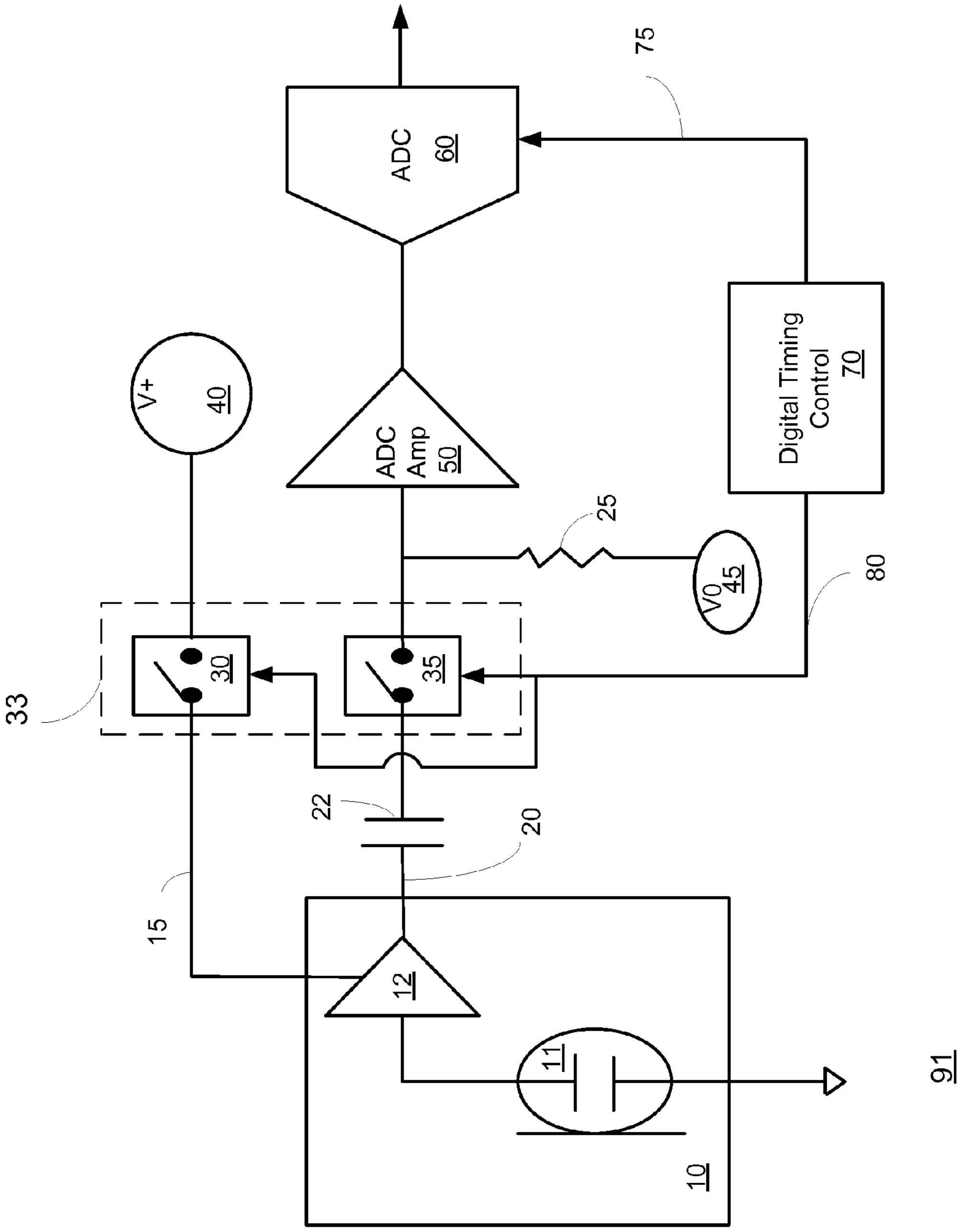
FIG. 1 is a schematic of a device according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device capable of executing the method.

Any reference in the specification to a device should be applied mutatis mutandis to a method that may be executed by the device.

The following examples refer to a Micro Electrical-Mechanical System (MEMS) microphone. It is noted that the MEMS microphone is merely an example of a microphone and that the invention is applicable to any type of microphone such as but not limited to non-MEMS microphones including a condenser microphone, an electret-condenser microphone, a dynamic microphone, a ribbon microphone, a Carbon microphone, a Piezoelectric microphone, a Fiber microphone, a Laser microphone, a Liquid microphone, and the like.

FIG. 1 illustrates a device 91 according to an embodiment of the invention.

Device 91 may be a digital MEMS microphone, may include a digital MEMS microphone, may be a mobile communication device, a headset, a voice triggered device, and the like.

Device 91 may include analog MEMS microphone 10, capacitor 22, switching circuit 33, ADC 60, ADC amplifier 50 and digital timing control 70.

Analog MEMS microphone 10 includes an electret microphone 11 and an MEMS microphone amplifier 12.

The MEMS microphone amplifier 12 may include a variety of different circuits including an operational amplifier or a single J-FET stage. The MEMS microphone amplifier 12 may be of any design.

The MEMS microphone amplifier 12 is powered by a positive voltage 15 and its function is to amplify and isolate the signal from the electret microphone 11.

First analog switch 30 is coupled between first power supply 40 V+ and MEMS microphone amplifier 12 (or analog MEMS microphone 11).

An output signal 20 that is outputted from analog MEMS microphone 10, is provided to capacitor 22. Capacitor is followed by second analog switch 35. Capacitor 22 is configured to block the DC voltage at the output of the MEMS microphone amplifier 12. The other side of the second analog switch 35 is connected to the input of the ADC Amplifier 50.

First and second analog switches 30 and 35 form a switching circuit 33. Any type of switching circuit 33 may be used instead of first and second analog switches 30 and 35.

The input stage of ADC amplifier 50 is modeled in FIG. 1 as including input impedance 25 that is fed by virtual voltage supply V0 45.

The signal 20 from the MEMS microphone amplifier 12 is sent to capacitor 22, passes through second analog switch 35 (when the second analog switch 35 is closed) and then is amplified by the ADC Amplifier 50 and applied to ADC 60 where an analog to digital conversion takes place.

A digital timing control block 70 is used to provide (a) control signals according to a sampling rate for the ADC 60 and (b) control signals to the first and second analog switches 30 and 35.

Output 75 from the digital timing control block 70 is applied to the ADC 60 and is used to set the sampling rate and the timing of the sampling and hold phase of the ADC 60.

Output 80 from the digital timing control block 70 is applied to the first and second analog switches 30 and 35 and is used to switch them both to the closed and open conditions simultaneously. It is noted that separate control signals may be sent to the first and second analog switches—allowing an independent control of these analog switches.

When first analog switch 30 is in the closed position, the first supply voltage 40 is applied to the MEMS microphone amplifier 12 and the MEMS microphone amplifier 12 is active. When first analog switch 30 is in the open position, the MEMS microphone amplifier 12 is inactive. As both analog switches 30 and 35 are controlled by the same signal 80, they will both be in the same open or closed condition. When the MEMS microphone amplifier 12 is active both analog switches 30 and 35 are closed (connected). The amplified analog signal from the electret microphone 11 is therefore applied via capacitor 22 and the closed first analog switch 35 to the input of the ADC amplifier 50.

The output signal 20 from the analog MEMS microphone 10 is usually an AC voltage that rides on a DC level that is much bigger than the amplitude of the AC voltage. Thus—without DC isolation—DC leakage that is much bigger than the AC voltage may mask the AC voltage or otherwise be interpreted as a valid AC voltage.

Second analog switch 35 is included so that DC blocking capacitor 22 is disconnected from the input to the ADC Amplifier 50 and therefore isolates the DC voltage step that results from the on off switching of the first supply voltage 40 at the MEMS microphone amplifier 12 from the ADC amplifier 50. The output of ADC amplifier 50 is connected to the input of the ADC 60. The sampling timing signal 75 is applied to the ADC such that the sample-and-hold phase and an analog to digital conversion phase in the ADC 60 is synchronized with the closing of the two analog switches 30 and 35. This is further explained in FIG. 2.

Figure 2:
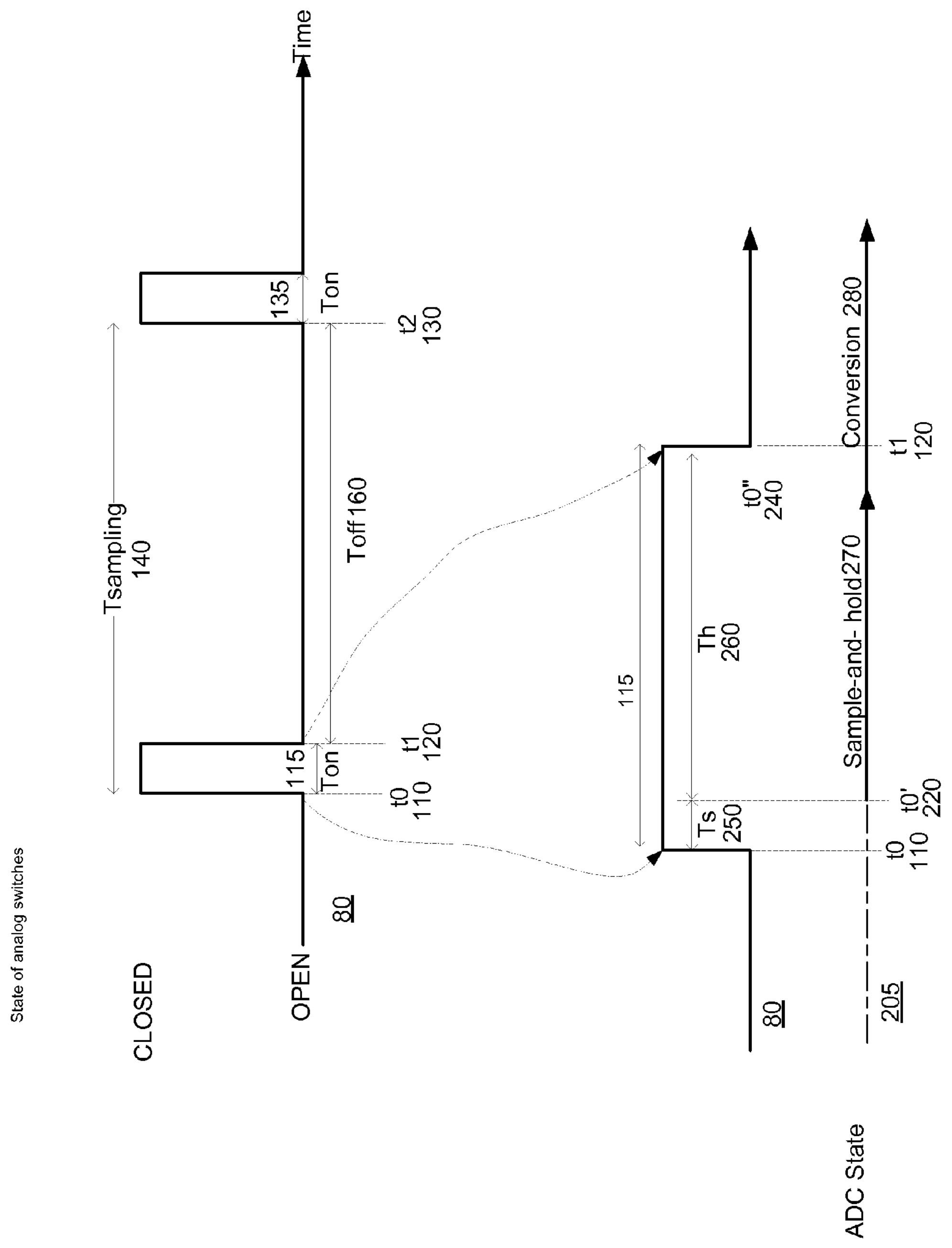
FIG. 2 is a timing diagram according to an embodiment of the invention.

FIG. 2 is a diagram according to an embodiment of the invention.

The upper part of FIG. 2 illustrates analog switch connected period 115 and analog switch connected period 135. It is noted that analog switch connected periods may equal to periods (ADC amplifier activation periods) during which the ADC amplifier is activated or may differs from ADC amplifier activation periods. For example, an ADC amplifier may be opened slightly after the analog switches enter their connected period.

The upper part of FIG. 2 illustrates values of control signal 80 and corresponding states of the first and second analog switches according to an embodiment of the invention.

Referring to a first analog switch open period 115—it starts at point of time t0 110 during which the first and second analog switches 30 and 35 are closed by control signal 80. At time t1 120, the two analog switches 30 and 35 are both set to the open position 125. The first analog switch disconnect period 115 spans between t0 and t1.

At time t2, 130, the two analog switches, 30 and 35 in FIG. 1, are both again set to the closed position during a second analog switch open period 135.

Analog switch disconnected period Toff 160 spans between t1 120 and t2 130.

The ADC samples at a sampling rate that has a sampling period Tsampling 140. Tsampling 140 spans between t0 110 and t2 130.

The lower part of FIG. 2 illustrates in greater detail the first analog switch connected period 115 and also samples the actions of the ADC 60.

At time t0, 110 the two analog switches 30 and 35 are both set to the closed position. A settling time Ts 250 after t0 110, at point in time t0' 220 the ADC 60 starts to perform an ADC sample-and-hold operation 270. The sample-and-hold operation 270 ends at point in time t0" 240, before the end (t1 120) of the analog switch connected period 115.

The ADC 60 then proceeds with the analog to digital conversion process 280. The analog to digital conversion process 280 may end after t1 120, before t1 120 or at t1 120.

Settling time Ts 250, may be set to allow the DC conditions of the MEMS microphone amplifier 12 and ADC Amplifier 50 to settle.

An ADC on period

Figure 3:
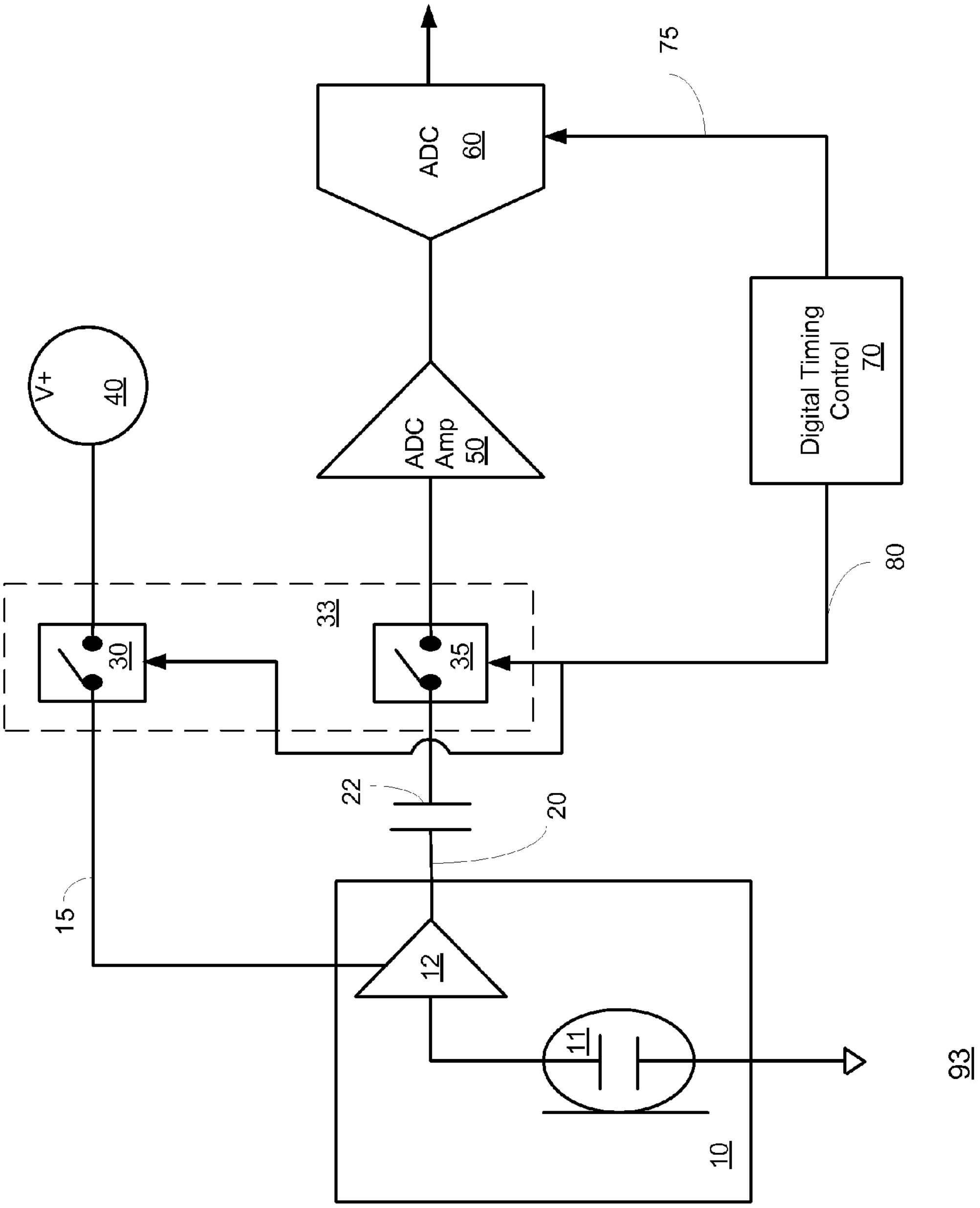
FIG. 3 is a schematic of a device according to an embodiment of the invention.

FIG. 3 illustrates device 93 according to an embodiment of the invention. Device 93 of FIG. 3 differs from device 91 of FIG. 1 by not including resistor 25 that represents the input resistance of ADC amplifier 50.

Figure 4:
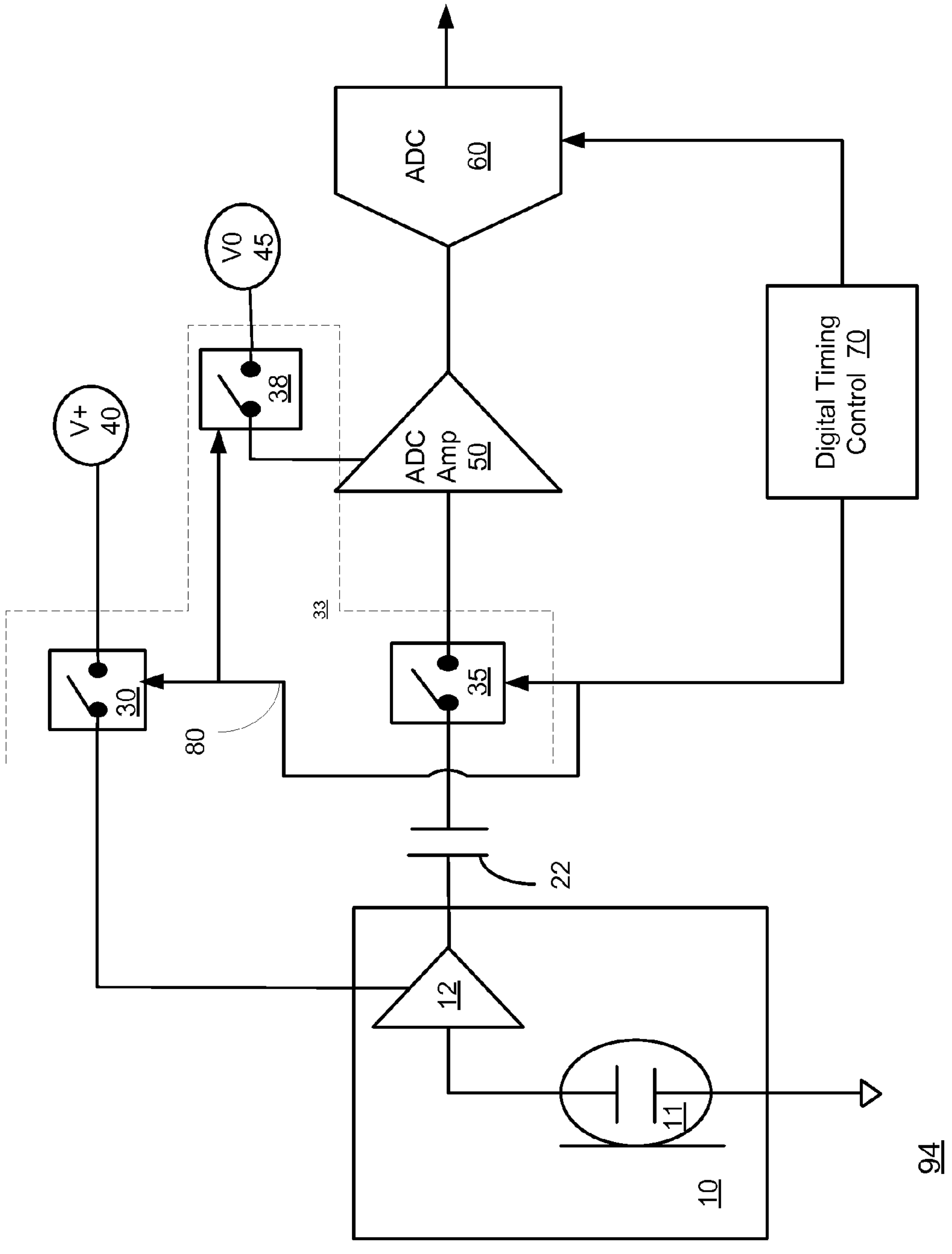
FIG. 4 is a schematic of a device according to an embodiment of the invention.

FIG. 4 illustrates device 94 according to an embodiment of the invention. Device 94 of FIG. 4 differs from device 91 of FIG. 1 by including a third analog switch 38 that is connected between the second supply voltage V0 45 and the ADC amplifier 50. The third analog switch 38 is controlled by the same control signal 80 as the first and second analog switches 30 and 35 and may be opened and closed at the same time as the first and second analog switches.

Figure 5:
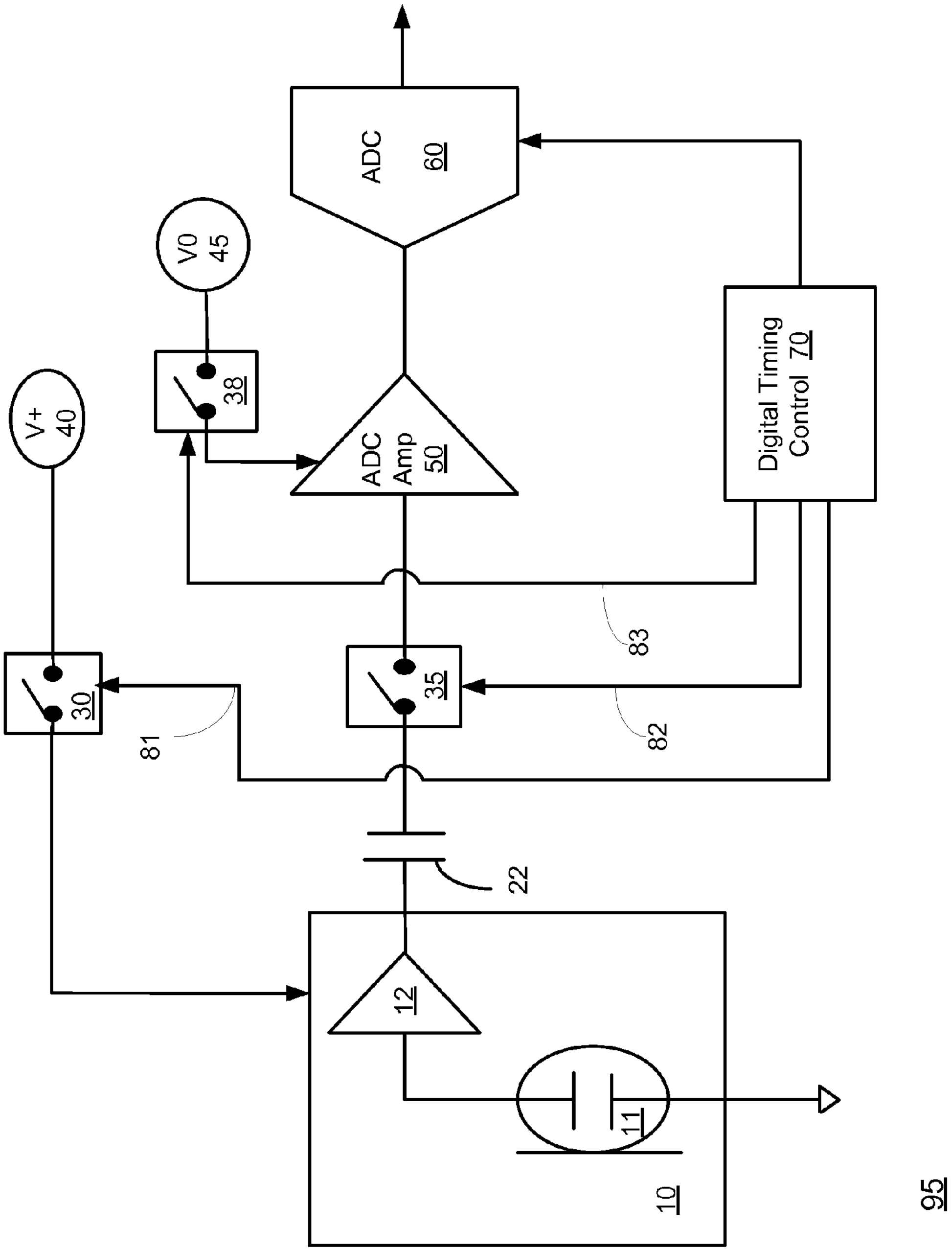
FIG. 5 is a schematic of a device according to an embodiment of the invention.

FIG. 5 illustrates device 95 according to an embodiment of the invention. Device 95 of FIG. 5 differs from device 91 of FIG. 1 by including a third analog switch 38 that is connected between the second supply voltage V0 45 and the ADC amplifier 50.

Each one of the first, second and third analog switches 30, 35 and 38 is controlled by a separate control signal—81, 82 and 83 respectively—allowing an independent control of each of these switches. Accordingly—the connection period of each one of the first, second and third analog switches may be equal to or may differ from a connection period of any other analog switch.

Figure 6:
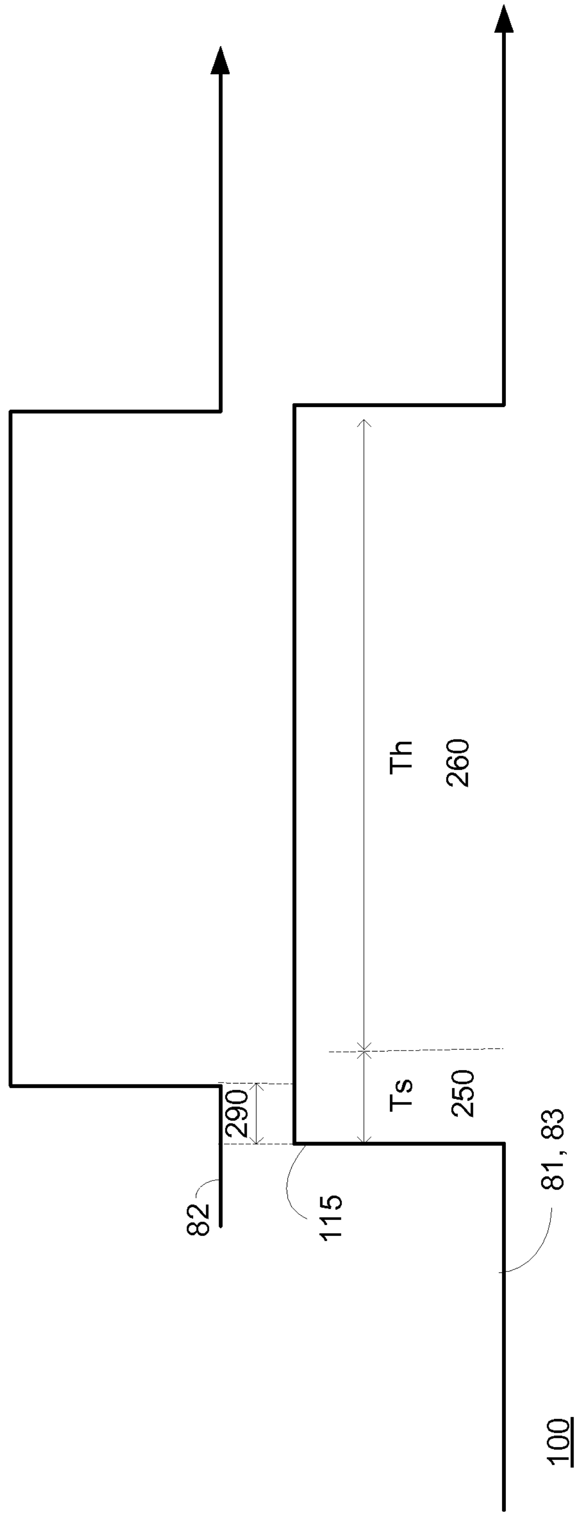
FIG. 6 is a timing diagram according to an embodiment of the invention.

FIG. 6 is a timing diagram of control signals 81, 82 and 83 according to an embodiment of the invention.

FIG. 6 shows that the second analog switch 35 that is fed by second control signal 82 may be closed an intermediate period (290) after first and third analog switches are closed.

Figure 7:
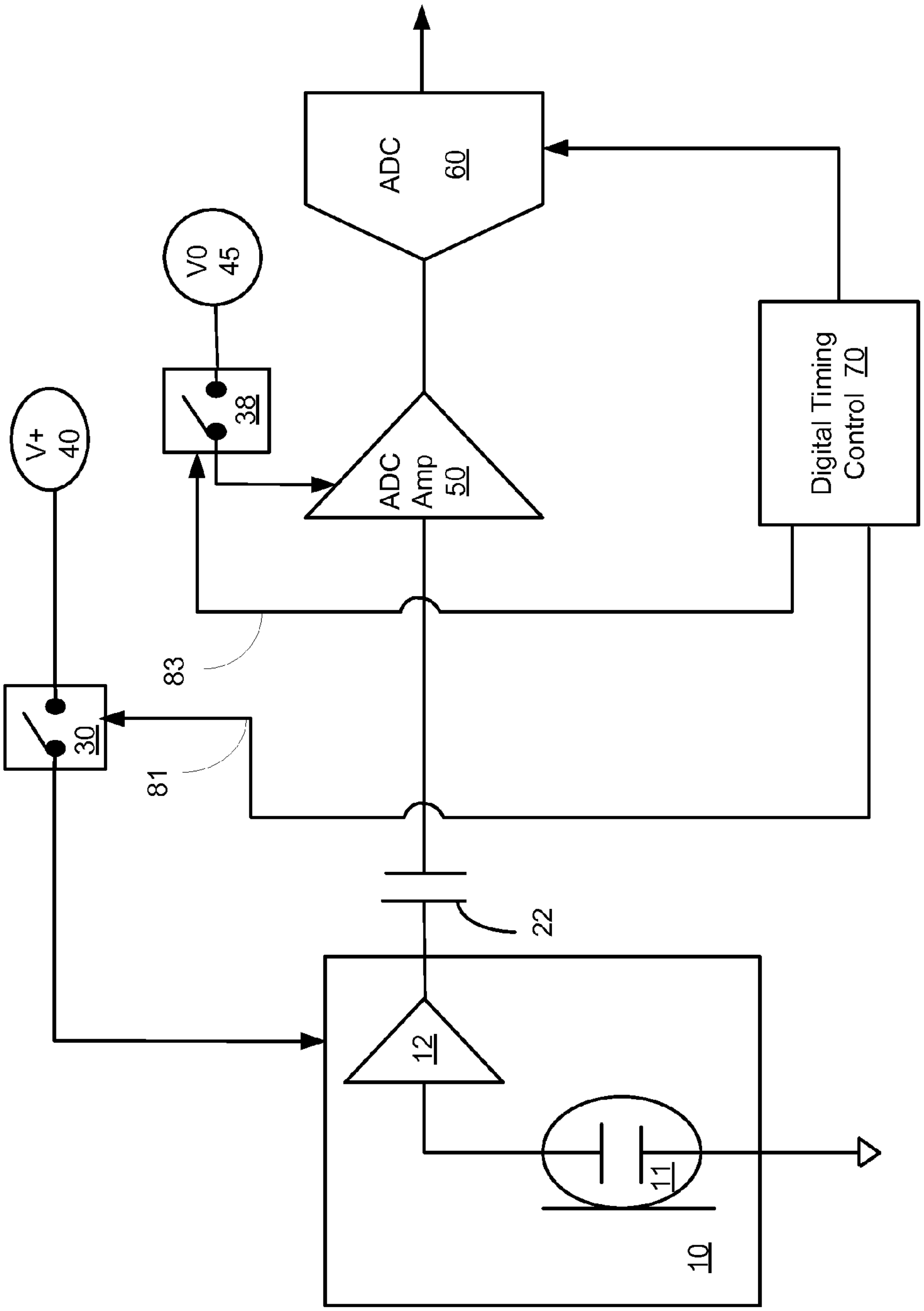
FIG. 7 is a schematic of a device according to an embodiment of the invention.

FIG. 7 illustrates device 97 according to an embodiment of the invention. Device 97 of FIG. 7 differs from device 91 of FIG. 1 by not including second analog switch 35.

Figure 8:
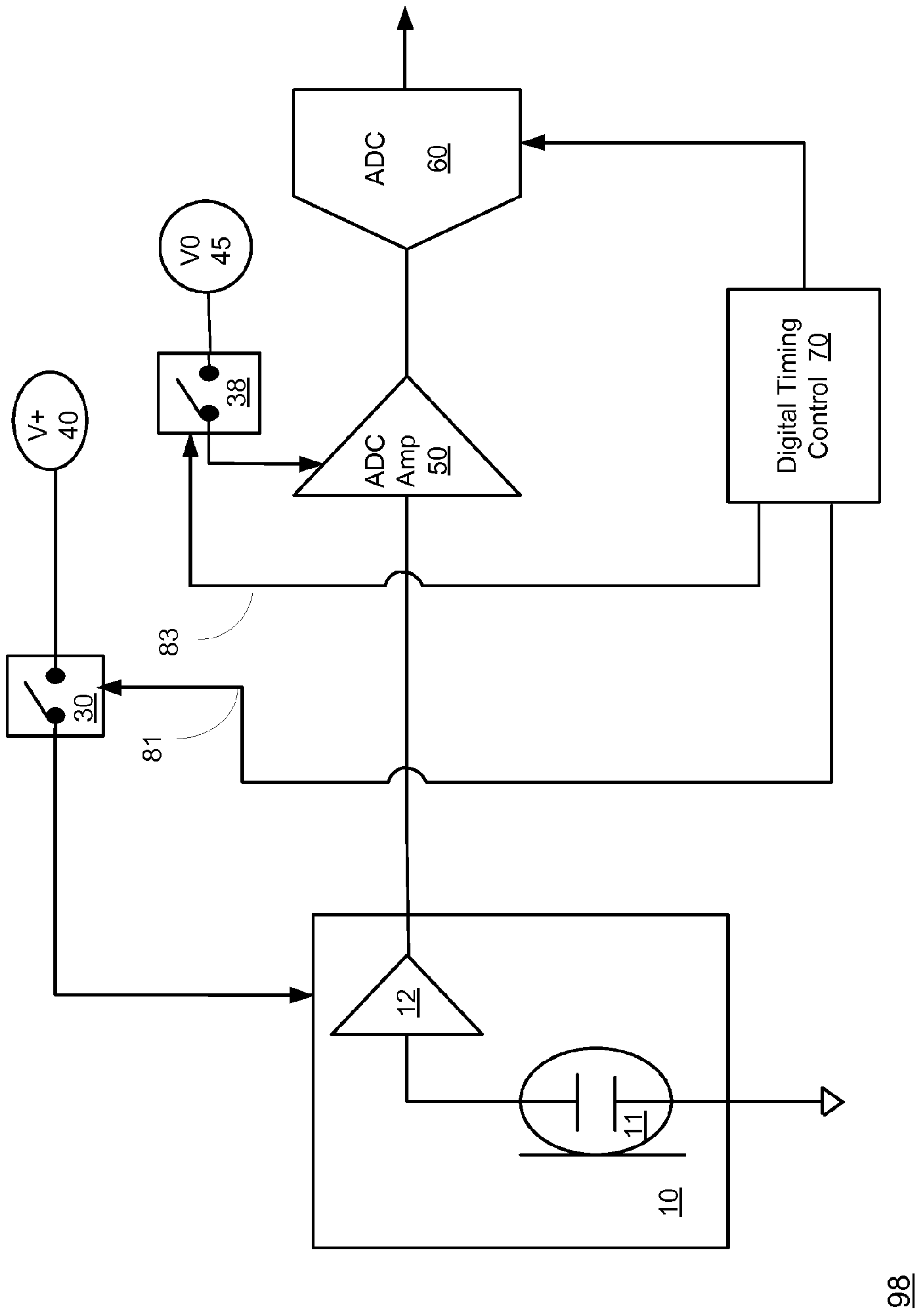
FIG. 8 is a schematic of a device according to an embodiment of the invention.

FIG. 8 illustrates device 98 according to an embodiment of the invention. Device 98 of FIG. 8 differs from device 91 of FIG. 1 by not including second analog switch 35 and by not including capacitor 22.

FIG. 9 is flow chart of method 200 according to an embodiment of the invention.

Method 200 includes stage 210 and 220.

Stage 210 may include repetitively triggering, by a digital timing control circuit that is coupled to an analog to digital converter (ADC), analog to digital conversion operations according to a sampling rate; wherein the sampling rate corresponds to a sampling period.

Stage 220 may include selectively providing power, by a switching circuit, to an analog microphone (such as but not limited to a Micro Electrical-Mechanical System (MEMS) microphone) and to an ADC amplifier in response to the sampling rate. The ADC amplifier is coupled to the ADC.

According to various embodiments of the invention method 700 may include at least the following steps:

a. Preventing the supply of power to the MEMS microphone and to the ADC amplifier during power prevention periods that have a duration that equals a majority of the sampling period.
b. Disconnecting by the switching circuit a capacitor that is coupled between an output of the analog MEMS microphone and an input of the ADC amplifier.
c. Disconnecting the capacitor from the ADC amplifier during at least a majority of power prevention periods.
d. Starting to power the analog MEMS microphone and the ADC amplifier a settling period before a beginning of each digital to analog conversion operation.
e. Stopping to power the analog MEMS microphone and the ADC amplifier after the ADC completed a sample and hold phase of the analog to digital conversion operation. During each settling period the analog MEMS microphone and the ADC amplifier are expected to settle. The settling period may have a duration that is a fraction of the sampling period.
f. Repetitively closing and opening (i) a first switch that is coupled between the analog MEMS microphone and a first power supply, and (ii) a second switch that is coupled between the capacitor and the ADC amplifier.
g. Repetitively closing and opening (i) a first switch that is coupled between the analog MEMS microphone and a first power supply, (ii) a second switch that is coupled between the capacitor and the ADC amplifier, and (iii) a third switch that is coupled between a second power supply and the ADC amplifier.
h. Closing the first switch and the third switch an intermediate period before closing the second switch.
i. Disconnecting the capacitor from the ADC amplifier during each power prevention period and each intermediate period that follows each power prevention period, wherein during each additional period a direct current (DC) level of an output of the analog MEMS microphone and a DC level of an input port of the ADC amplifier is expected to settle.

It is noted that the mentioned above figures provide only various examples of embodiments of the invention and they illustrate discrete components to illustrate the blocks. Any of the devices mentioned above may be embodied (or may be) a part of an audio processing integrated circuit Different analog microphones and different amplifiers may impose other switching related issues to be solved when switching on and off the microphone DC voltage but such issues can be solved by those skilled in the art, by the addition of analog switches in the appropriate junctions of the analog circuits.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A device comprising:

an analog microphone;

an analog to digital converter (ADC);

an ADC amplifier;

a digital timing control circuit; and a switching circuit;

wherein the digital timing control circuit is configured to repetitively trigger analog to digital conversion operations according to a sampling rate; wherein the sampling rate corresponds to a sampling period;

wherein the switching circuit is configured to selectively provide power to the analog microphone and to the ADC amplifier in response to the sampling rate.

2. The device according to claim 1 wherein the switching circuit is configured to prevent the supply of power to the microphone and to the ADC amplifier during power prevention periods that have a duration that equals a majority of the sampling period.

3. The device according to claim 1 comprising a capacitor coupled between an output of the analog microphone and an input of the ADC amplifier.

4. The device according to claim 3 wherein the switching circuit is configured to disconnect the capacitor from the ADC amplifier during at least a majority of power prevention periods.

5. The device according to claim 3 wherein the switching circuit comprises (i) a first switch that is coupled between the analog microphone and a first power supply, and (ii) a second switch that is coupled between the capacitor and the ADC amplifier.

6. The device according to claim 3 wherein the switching circuit comprises (i) a first switch that is coupled between the analog microphone and a first power supply, (ii) a second switch that is coupled between the capacitor and the ADC amplifier, and (iii) a third switch that is coupled between a second power supply and the ADC amplifier.

7. The device according to claim 6 wherein the first switch and the third switch are configured to be closed an intermediate period before the second switch is closed.

8. The device according to claim 3 wherein the switching circuit is further configured to disconnect the capacitor from the ADC amplifier during each power prevention period and each intermediate period that follows each power prevention period, wherein during each additional period a direct current (DC) level of an output of the analog microphone and a DC voltage level of an input port of the ADC amplifier is expected to settle.

9. The device according to claim 1 wherein the switching circuit is configured to (a) start powering the analog microphone and the ADC amplifier a settling period before a beginning of each digital to analog conversion operation and (b) stop powering the analog microphone and the ADC amplifier after the ADC completed a sample and hold phase of the analog to digital conversion operation; wherein during each settling period the analog microphone and the ADC amplifier are expected to settle.

10. The device according to claim 9 wherein the settling period has a duration that is a fraction of the sampling period.

11. The device according to claim 1 wherein a duty cycle of the analog microphone does not exceed 10 percent.

12. The device according to claim 1 wherein the microphone is a Micro Electrical-Mechanical System (MEMS) microphone.

13. A method, comprising:

repetitively triggering, by a digital timing control circuit that is coupled to an analog to digital converter (ADC), analog to digital conversion operations according to a sampling rate; wherein the sampling rate corresponds to a sampling period; and selectively providing power, by a switching circuit, to an analog microphone and to an ADC amplifier in response to the sampling rate; wherein the ADC amplifier is coupled to the ADC.

14. The method according to claim 13 wherein the selectively providing of power comprises preventing the supply of power to the microphone and to the ADC amplifier during power prevention periods that have a duration that equals a majority of the sampling period.

15. The method according to claim 13 wherein a capacitor is coupled between an output of the analog microphone and an input of the ADC amplifier.

16. The method according to claim 15 comprising disconnecting the capacitor from the ADC amplifier during at least a majority of power prevention periods.

17. The method according to claim 15 wherein the switching circuit comprises (i) a first switch that is coupled between the analog microphone and a first power supply, and (ii) a second switch that is coupled between the capacitor and the ADC amplifier.

18. The method according to claim 15 wherein the switching circuit comprises (i) a first switch that is coupled between the analog microphone and a first power supply, (ii) a second switch that is coupled between the capacitor and the ADC amplifier, and (iii) a third switch that is coupled between a second power supply and the ADC amplifier.

19. The method according to claim 18 comprising closing the first switch and the third switch an intermediate period before closing the second switch.

20. The method according to claim 15 comprising disconnecting the capacitor from the ADC amplifier during each power prevention period and each intermediate period that follows each power prevention period, wherein during each additional period a direct current (DC) level of an output of the analog microphone and a DC level of an input port of the ADC amplifier is expected to settle.

21. The method according to claim 13 comprising:

starting to power the analog microphone and the ADC amplifier a settling period before a beginning of each digital to analog conversion operation;

stopping to power the analog microphone and the ADC amplifier after the ADC completed a sample and hold phase of the analog to digital conversion operation;

wherein during each settling period the analog microphone and the ADC amplifier are expected to settle.

22. The method according to claim 21 wherein the settling period has a duration that is a fraction of the sampling period.

23. The method according to claim 13 wherein a duty cycle of the analog microphone does not exceed 10 percent.

24. The method according to claim 13 wherein the microphone is a Micro Electrical-Mechanical System (MEMS) microphone.

* * * * *